US011303203B2

(12) United States Patent
Eguchi

(10) Patent No.: US 11,303,203 B2
(45) Date of Patent: Apr. 12, 2022

(54) SEMICONDUCTOR DEVICE

(71) Applicant: Mitsubishi Electric Corporation, Tokyo (JP)

(72) Inventor: Keisuke Eguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 6 days.

(21) Appl. No.: 17/076,172

(22) Filed: Oct. 21, 2020

(65) Prior Publication Data

US 2021/0218328 A1   Jul. 15, 2021

(30) Foreign Application Priority Data

Jan. 9, 2020   (JP) .............................. JP2020-001984

(51) Int. Cl.
*H02M 1/44* (2007.01)
*H02M 1/088* (2006.01)
*H02M 7/5387* (2007.01)
*H01L 25/18* (2006.01)

(52) U.S. Cl.
CPC ............. *H02M 1/44* (2013.01); *H02M 1/088* (2013.01); *H02M 7/5387* (2013.01); *H01L 25/18* (2013.01)

(58) Field of Classification Search
CPC .......... H02M 1/44; H02M 1/08; H02M 1/088; H02M 7/5387; H01L 25/18
See application file for complete search history.

(56) References Cited

U.S. PATENT DOCUMENTS

2007/0216469 A1 * 9/2007 Sakamoto ............ H03K 17/063
327/519
2018/0041138 A1   2/2018 Nishikawa et al.

FOREIGN PATENT DOCUMENTS

EP           3273588 A1 *  1/2018  ............ H02M 7/797
JP        2017-017842 A   1/2017

* cited by examiner

*Primary Examiner* — Adolf D Berhane
(74) *Attorney, Agent, or Firm* — Studebaker & Brackett PC

(57) ABSTRACT

The object of the present disclosure is to suppress the conduction noise in a semiconductor device. A semiconductor device includes an inverter section being a full-bridge inverter, and a reflux section that short-circuits between output terminals U and V of the inverter section, in which impedances and are provided between each of freewheel diodes and of the upper arm and the output terminals U and V, and impedances and are provided between the freewheel diodes and of the lower arm and the input terminal N of in the inverter section, and the impedances to are greater than parasitic impedance of wiring assuming that IGBTs to and the output terminals U and V or the IGBTs and the input terminal N are connected only by the wiring.

8 Claims, 13 Drawing Sheets

F I G. 1
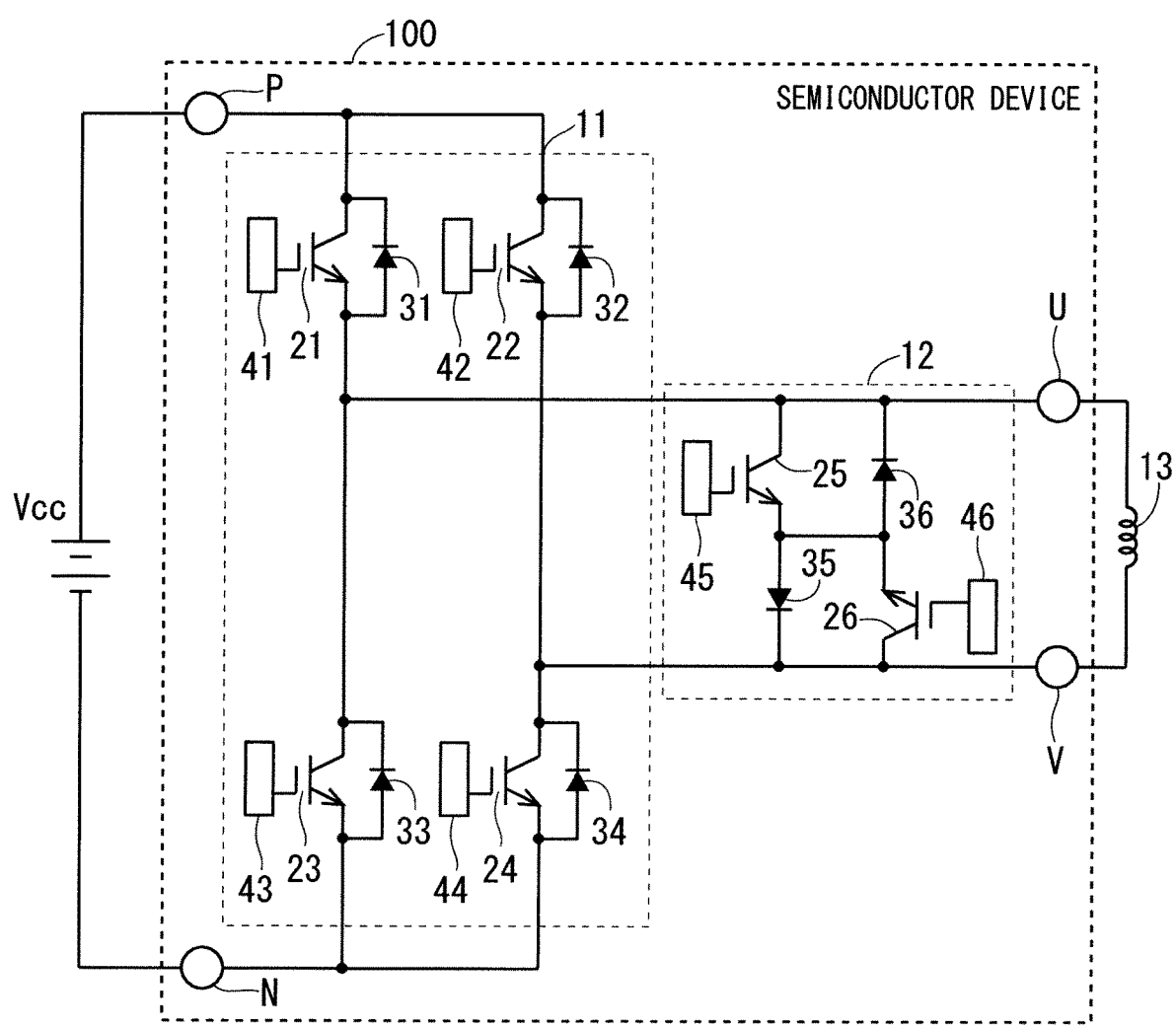

F I G. 7
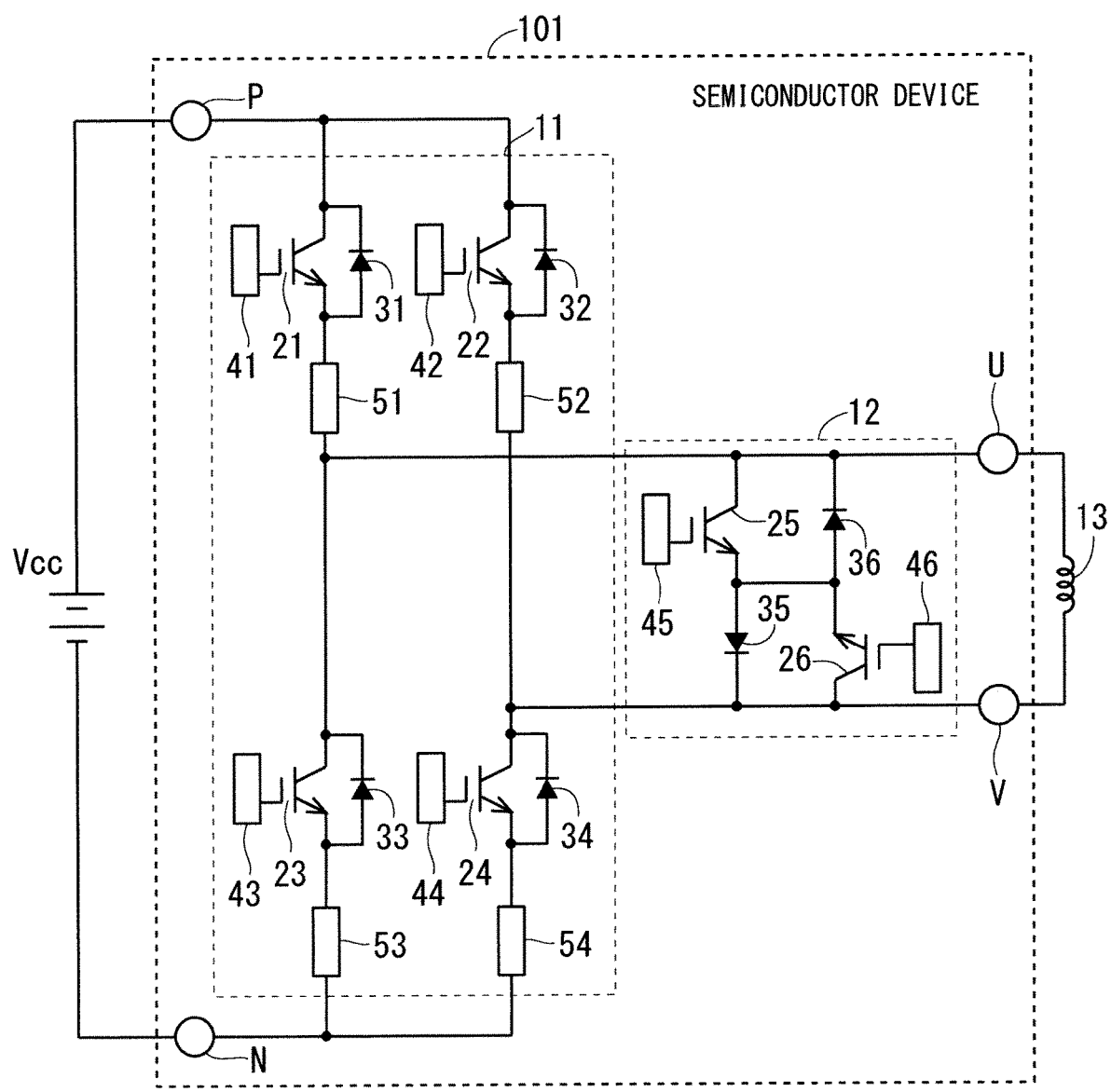

SEMICONDUCTOR DEVICE

BACKGROUND OF THE INVENTION

Field of the Invention

The present disclosure relates to a semiconductor device.

Description of the Background Art

In the field of semiconductor devices, thinning of semiconductor elements has conventionally been performed in order to suppress a temperature rise generated when a semiconductor operates. However, under the circumstances where downsizing of semiconductor devices is ongoing, an inevitable reduction in the area of a semiconductor element has been made, and as the improvement in characteristics of semiconductor elements approaches the limit, the thermal design of semiconductor modules has become even harsher.

In recent years, in power converters such as inverters, a highly efficient and reliable inverter concept (HERIC) circuit in which a full-bridge inverter and a switching element that is short-circuited are combined has been used for improving heat radiation (see Japanese Patent Application Laid-Open No. 2017-17842). The inverter circuit disclosed in Japanese Patent Application Laid-Open No. 2017-17842 suppresses an excessive voltage such as a surge voltage by using a clamp element in a reflux section of the HERIC circuit. In the inverter circuit disclosed in Japanese Patent Application Laid-Open No. 2017-17842, only half the power supply voltage Vcc is required as the voltage for switching, and the effect of reduction in switching loss is expected. However, the current flowing into the inverter section at the time of reflux causes potential fluctuation at the output terminals in the inverter section, and when high-scale potential fluctuation occurs, the potential fluctuation may possibly deteriorate the conduction noise.

SUMMARY

The object of the present disclosure is to suppress the conduction noise in a semiconductor device.

A semiconductor device of the present disclosure includes an inverter section being a full-bridge inverter and a reflux section. A reflux section short-circuits between output terminals of the inverter section. Each of phases of the inverter section includes a first switching element and a freewheel diode. The freewheel diode is connected in antiparallel to the first switching element. The reflux section includes two serial connection bodies of second switching elements and diodes. The two serial connection bodies are connected in parallel between the output terminals such that conduction directions thereof are opposed to each other. The semiconductor device of the present disclosure includes impedance provided between each of the freewheel diodes of an upper arm and the output terminals, and impedance provided between each of the freewheel diodes of a lower arm and an input terminal in the inverter section. The impedances are greater than parasitic impedance of wiring assuming that the first switching elements and the output terminals or the first switching elements and the input terminal are connected only by wiring.

The semiconductor device of the present disclosure includes impedance provided between each of the freewheel diodes of an upper arm and the output terminals, and impedance provided between each of the freewheel diodes of a lower arm and the input in the inverter section. Therefore, when the switching of each of the first switching elements is performed at different timing, the current flowing into the inverter section and flowing through the freewheel diodes can be suppressed. Thus, the potential fluctuations of the output terminals are suppressed, and the conduction noise is reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram illustrating a HERIC circuit according to an underlying technique;

FIG. 7 is a circuit diagram of the semiconductor device according to Embodiment 1;

DESCRIPTION OF THE PREFERRED EMBODIMENTS

A. Underlying Technique

Figure 2:
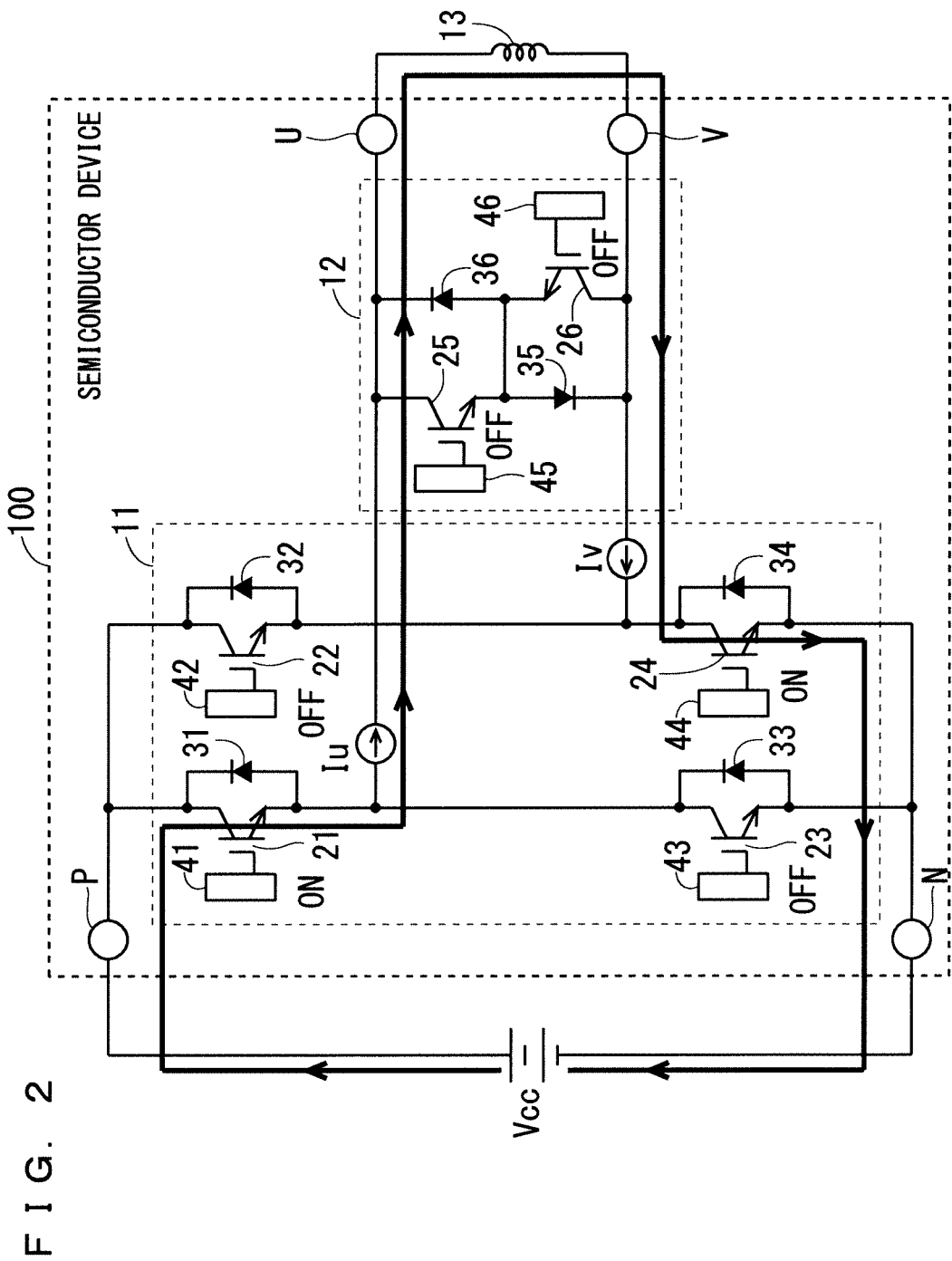
FIG. 2 is a circuit diagram illustrating a current path in a period t1 of FIG. 6 in the HERIC circuit according to the underlying technique.

FIG. 1 illustrates a HERIC circuit 100 according to an underlying technique. The HERIC circuit 100 is configured to include an inverter section 11 being a full-bridge inverter, and a reflux section 12 that short-circuits between output terminals U and V of the inverter section 11.

The inverter section 11 includes IGBTs 21 to 24 being switching elements of four phases, freewheel diodes 31 to 34 connected in antiparallel to each of the IGBTs 21 to 24, and gate drive circuits 41 to 44 supplying a gate voltage to each of the IGBTs 21 to 24. The IGBT 21 is the first phase, the IGBT 22 is the second phase, the IGBT 23 is the third phase, and the IGBT 24 is the fourth phase. The IGBTs 21 to 24 are also referred to as first switching elements. The power supply voltage Vcc is applied between input terminals P and N of the inverter section 11, and the load 13 is connected between the output terminals U and V.

The reflux section 12 includes IGBTs 25 and 26, diodes 35 and 36 connected in series to the IGBTs 25 and 26, respectively, and gate drive circuits 45 and 46 supplying a gate voltage to the IGBTs 25 and 26. That is, the reflux section 12 includes a serial connection body of the IGBT 25 and the diode 35 and a serial connection body of the IGBT 26 and the diode 36. The two serial connection bodies are connected in parallel between the output terminals U and V such that the conduction directions thereof are opposed to each other. The IGBT 25 is the fifth phase, and the IGBT 26 is the sixth phase. The IGBTs 25 and 26 are also referred to as second switching elements.

A mechanism of how the conduction noise deteriorates in the HERIC circuit 100 will be described. The inverter operation in the HERIC circuit 100 is divided into (1) a switching operation by the first-phase IGBT 21 and the fourth-phase IGBT 24, and (2) a switching operation by the second-phase IGBT 22 and the third-phase IGBT 23. Hereinafter, the switching operation of (1) will be described as an example.

Figure 6:
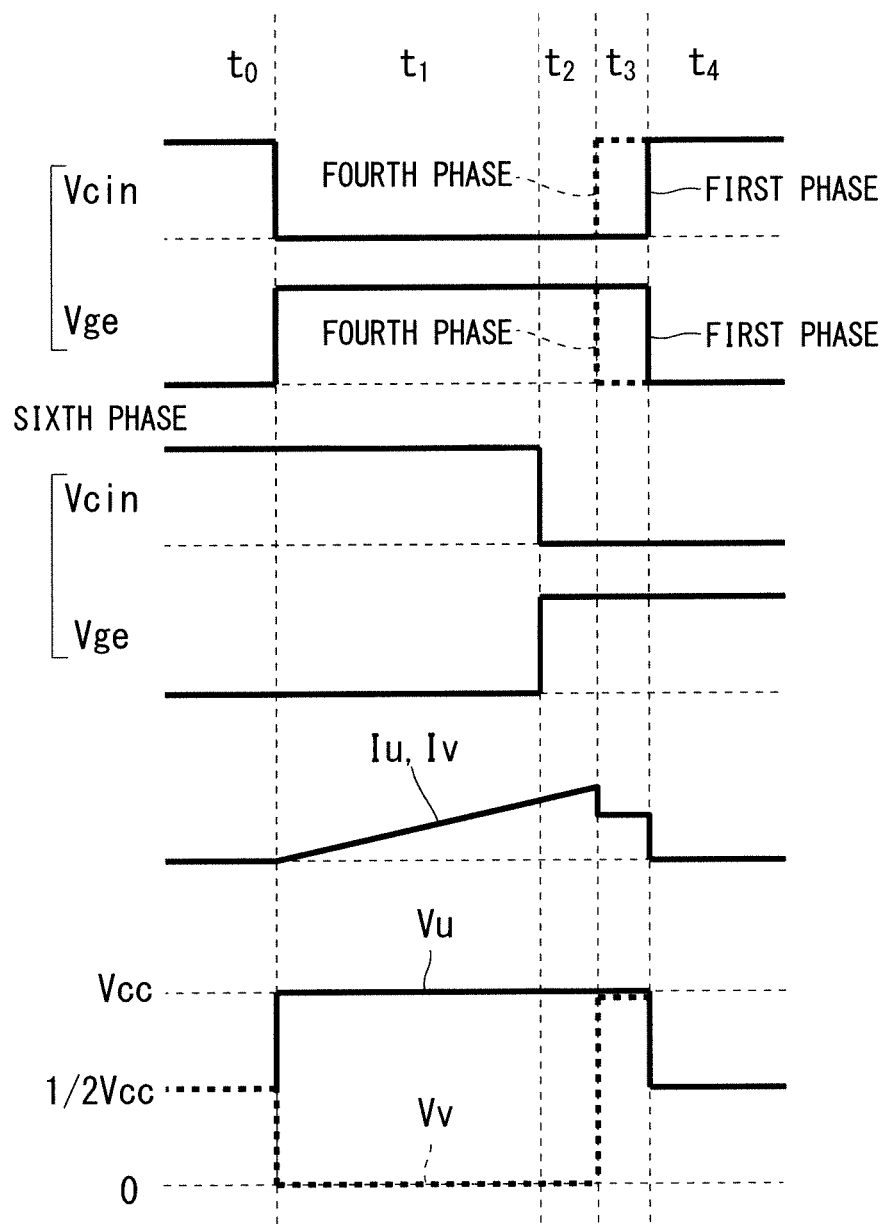
FIG. 6 is a diagram illustrating the relationship between the switching states of the first, fourth, and sixth phases and the current and voltage at the output terminals in the HERIC circuit according to the underlying technique.

FIG. 6 illustrates the relationship between the switching states of the first, fourth and sixth phases and the current and voltage at the output terminals U and V in the HERIC circuit 100. Vge represents the gate voltage of the IGBT of each phase, and Vcin is the collector voltage of the IGBT of each phase. Iu and Iv represent the currents at the output terminals U and V, respectively. Vu and Vv represent the potential at the output terminals U and V, respectively.

In the period t0 of FIG. 6, the first-phase IGBT 21 and the fourth-phase IGBT 24 are both off. Then in the period t1 of FIG. 6, the first-phase IGBT 21 and the fourth-phase IGBT 24 are turned on. As indicated by the arrows in FIG. 2, the current path at this time is that the first-phase IGBT 21, the load 13, the fourth-phase IGBT 24, the power supply, and the first-phase IGBT 21 are passed in this order.

Figure 3:
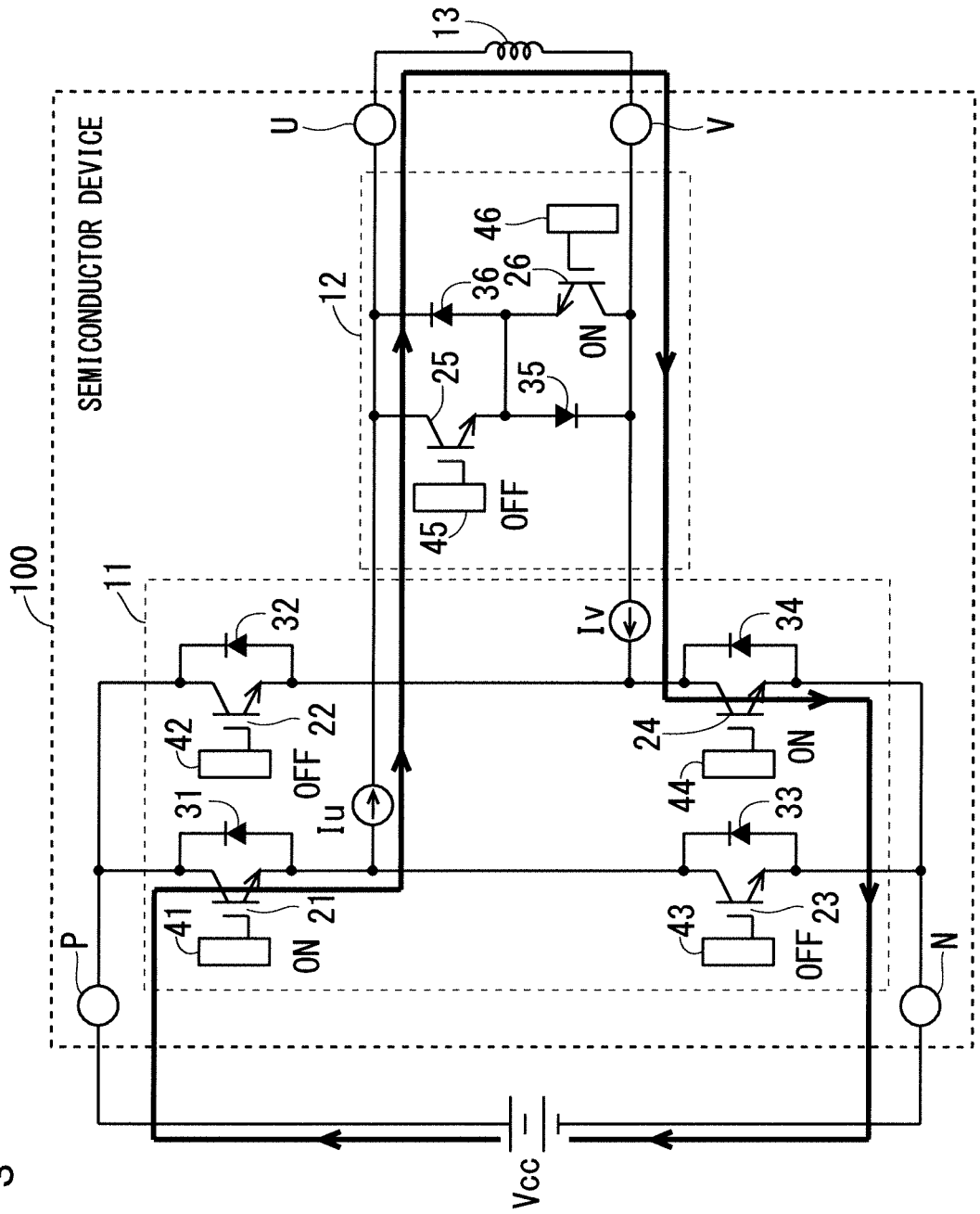
FIG. 3 is a circuit diagram illustrating a current path in a period t2 of FIG. 6 in the HERIC circuit according to the underlying technique.

Next, in the period t2 of FIG. 6, the sixth-phase IGBT 26 is turned on immediately before the first-phase IGBT 21 and the fourth-phase IGBT 24 are turned off. At this time, the current path is as illustrated by arrows in FIG. 3, which is the same as before the sixth-phase IGBT 26 is turned on.

Figure 4:
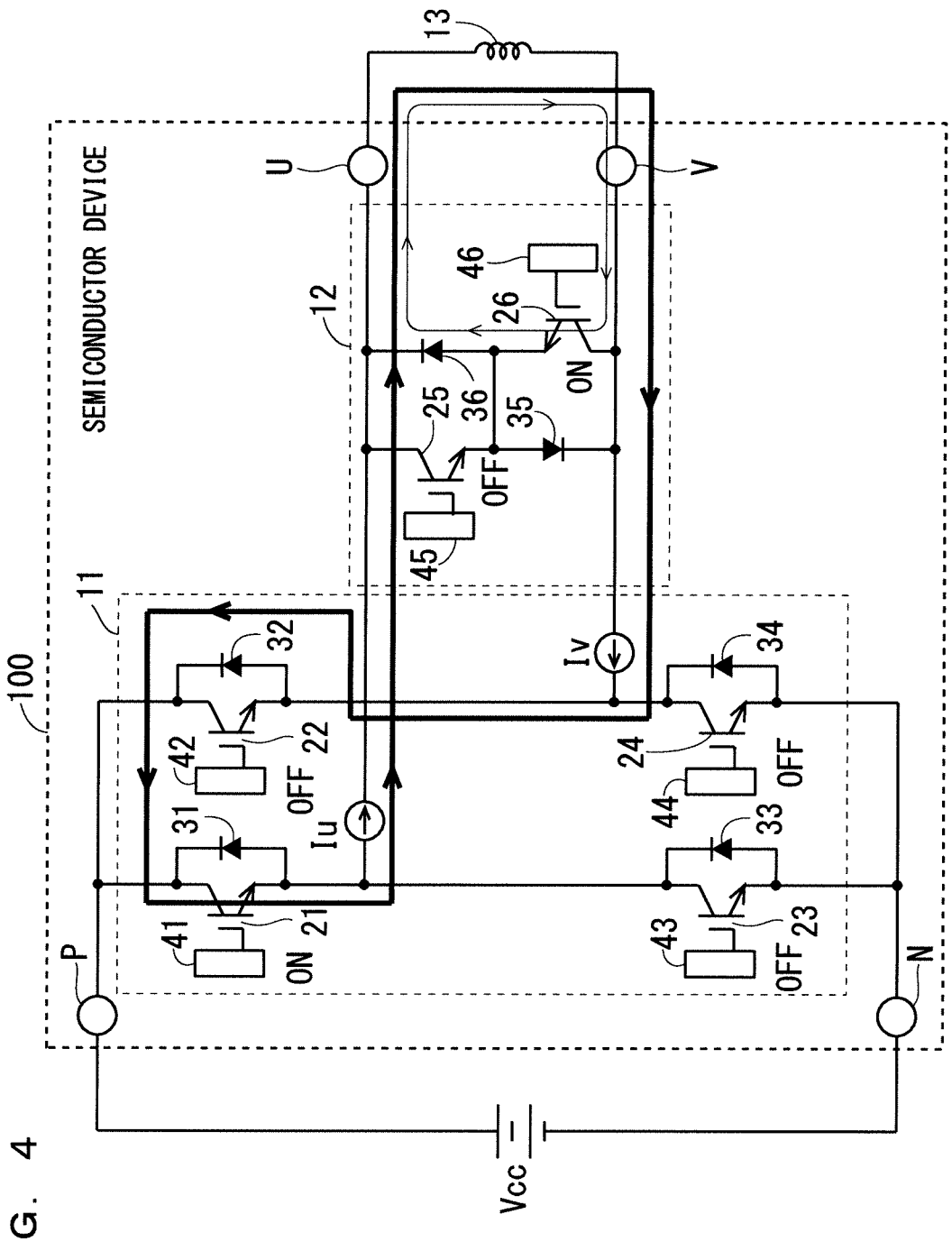
FIG. 4 is a circuit diagram illustrating a current path in a period t3 of FIG. 6 in the HERIC circuit according to the underlying technique.

Next, the first-phase IGBT 21 and the fourth-phase IGBT 24 perform a turn-off operation. Ideally, the first-phase IGBT 21 and the fourth-phase IGBT 24 are simultaneously turned off; however, both IGBTs practically turn off at different timing due to variations in the mass production of the IGBT or variations in input signals. For example, as illustrated in the period t3 in FIG. 6, when the fourth-phase IGBT 24 turns off earlier than the first-phase IGBT 21 does, the current path is that the first-phase IGBT 21, the load 13, the second-phase freewheeling diode 32, and the first-phase IGBT 21 are passed in this order as illustrated by the thick arrows in FIG. 4. In addition to the current flowing into the inverter section 11, a reflux current flowing through the sixth-phase IGBT 26 and the diode 36 is also generated, as indicated by thin arrows in FIG. 4. However, the reflux current is smaller than the current flowing into the inverter section 11. At this time, the potential Vv of the output terminal V rises from 0 to Vcc. In FIG. 4, the magnitude relationship between both currents is represented by the thickness of the arrows indicating the paths.

Figure 5:
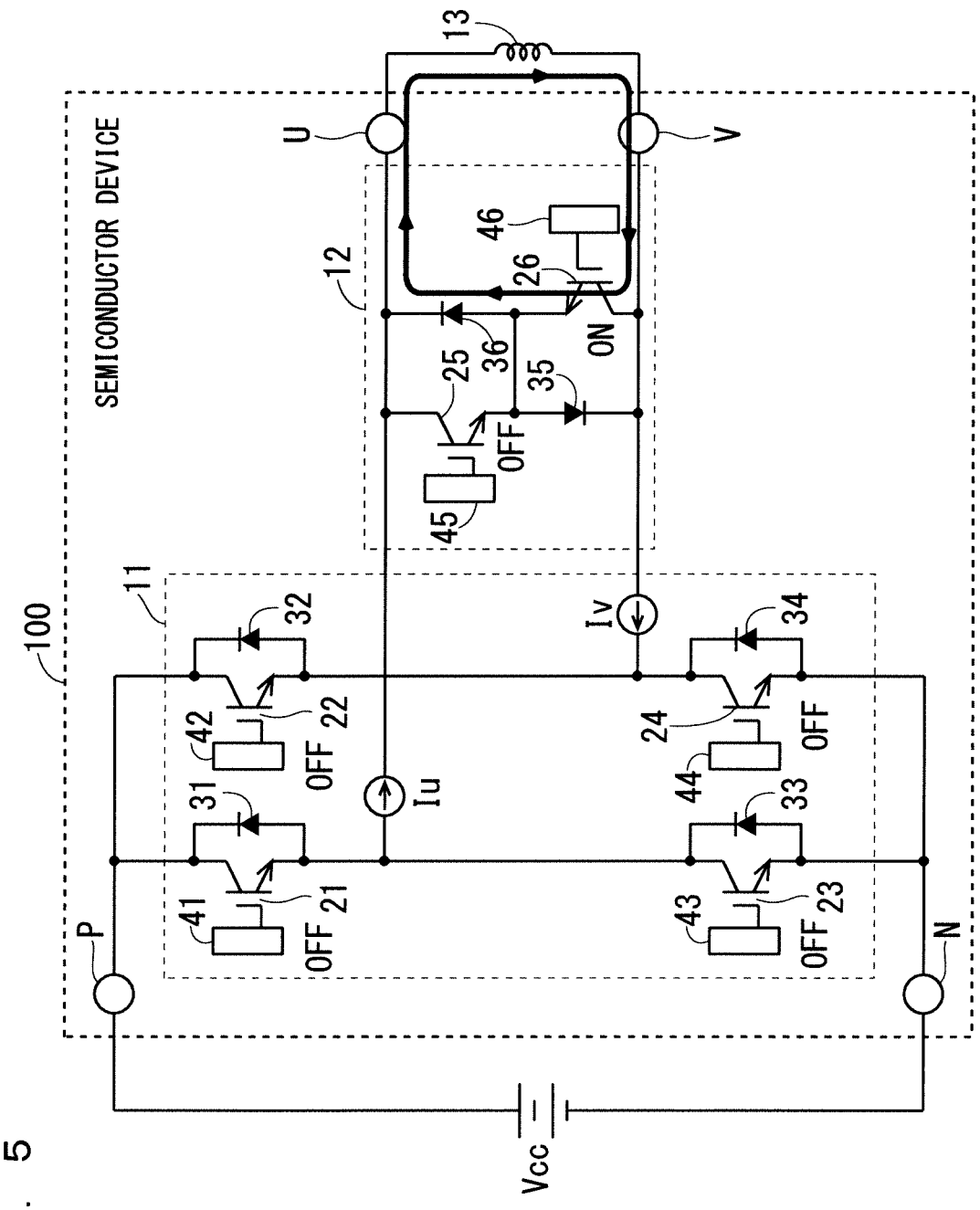
FIG. 5 is a circuit diagram illustrating a current path in a period t4 of FIG. 6 in the HERIC circuit according to the underlying technique.

Next, as illustrated in the period t4 in FIG. 6, the first-phase IGBT 21 is turned off. At this time, the IGBTs of all phases are turned off in the inverter section 11, and no current flows into the inverter section 11. Therefore, as illustrated in FIG. 5, the reflux current passing through the sixth-phase IGBT 26 and the diode 36 is larger than that in the period t3. At this time, the potential Vv of the output terminal V drops from Vcc to ½Vcc.

Although the switching operation by the first- and fourth-phase IGBTs 21 and 24 has been described above, the same applies to the switching operation by the second- and third-phase IGBTs 22 and 23. In such a case, the operation of the sixth-phase IGBT 26 in the above description is replaced with the operation of the fifth-phase IGBT 25.

The HERIC circuit 100 ideally operates when the potential of the terminal U is between Vcc and ½Vcc and the potential of the terminal V is between 0 and ½Vcc. If the first-phase IGBT 21 and the fourth-phase IGBT 24 perform the turn-off operation almost at the same time, that would be the realization of the ideal operation. However, if the fourth-phase IGBT 24 is turned off earlier than the first-phase IGBT 21 is as described above, a phenomenon occurs in which the potential of the output terminal V rises from 0 V to Vcc, being a cause of conduction noise. This phenomenon is caused by the current flowing through the freewheel diodes 31 to 34 in the inverter section 11 due to the different turn-off timing. Nonetheless, the freewheel diodes 31 to 34 of the inverter section 11 are indispensable to prevent the reverse withstand voltage from being applied to the IGBTs 21 to 24, and exclusion thereof from the configuration of the HERIC circuit 100 cannot be done.

Therefore, in semiconductor devices of respective Embodiments described below, the conduction noise is suppressed while leaving the freewheel diodes 31 to 34 in the inverter section 11.

B. Embodiment 1

B-1. Configuration

FIG. 7 is a circuit diagram of a semiconductor device 101 according to Embodiment 1. The semiconductor device 101 is obtained by adding impedance between the anode of each freewheeling diode 31 to 34 of the inverter section 11 and the output terminals or the input terminal in the HERIC circuit 100 of the underlying technique. Specifically, in the upper arm, impedance 51 is connected between the anode of the freewheel diode 31 of the first-phase IGBT 21 and the output terminal U, and impedance 52 is connected between the anode of the freewheel diode 32 of the second-phase IGBT 22 and the output terminal V. And, in the lower arm, impedance 53 is connected between the anode of the freewheel diode 33 of the third-phase IGBT 23 and the input terminal N and impedance 53, 54 is connected between the anode of the freewheel diode 34 of the fourth-phase IGBT 24 and the input terminal N.

The impedances 51 to 54 are greater than parasitic impedance of the normal wiring (for example, 0.55 mΩ) assuming that the IGBT 21 and the output terminal U, the IGBT 22 and the output terminal V, and the IGBTs 23 and 24 and the input terminal N are respectively connected only by normal wiring. The impedances 51 to 54 are, for example, 10 mΩ or more.

B-2. Operation

Figure 8:
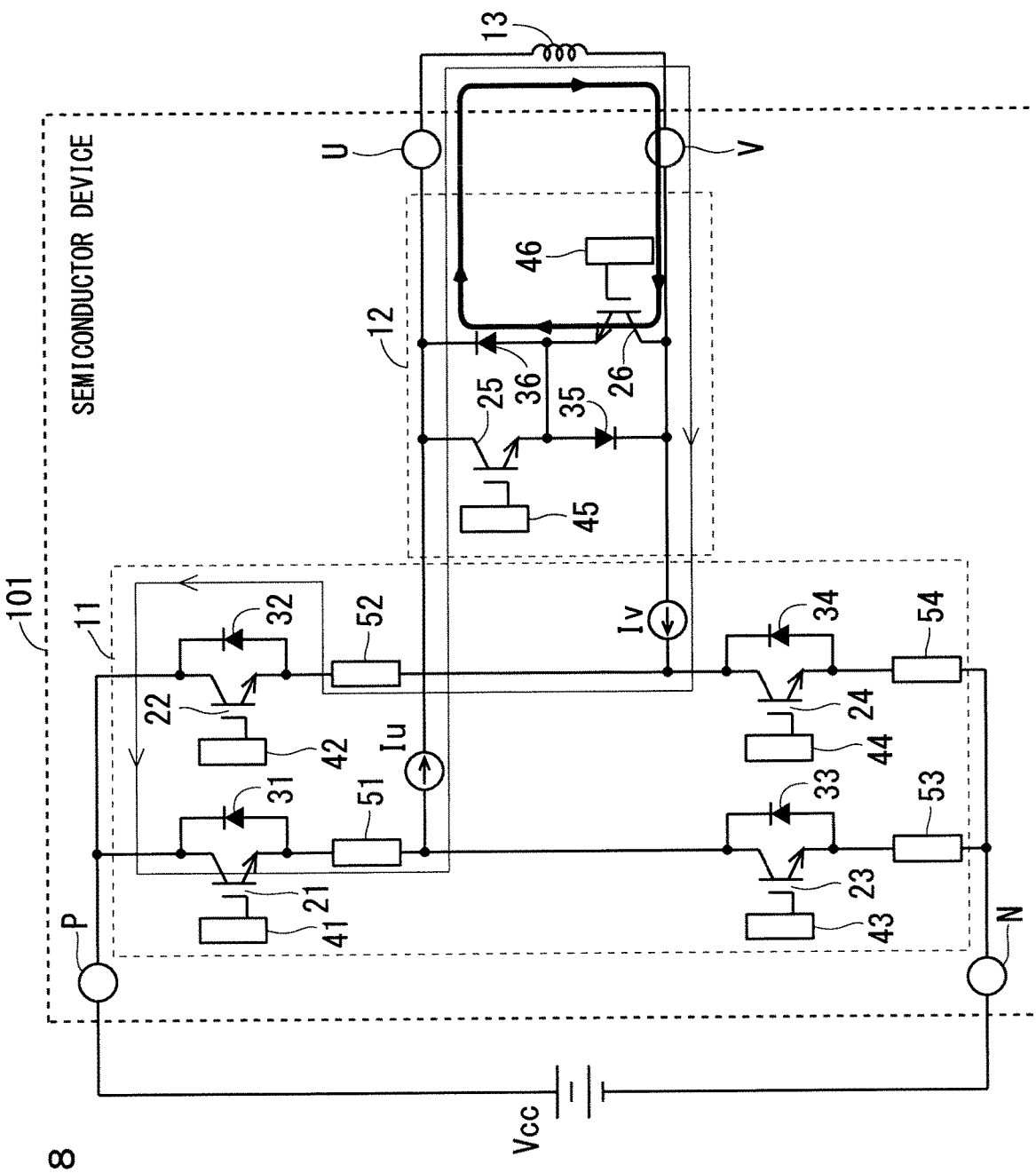
FIG. 8 is a circuit diagram illustrating a current path in a period t3 of FIG. 9 in the HERIC circuit according to Embodiment 1.
Figure 9:
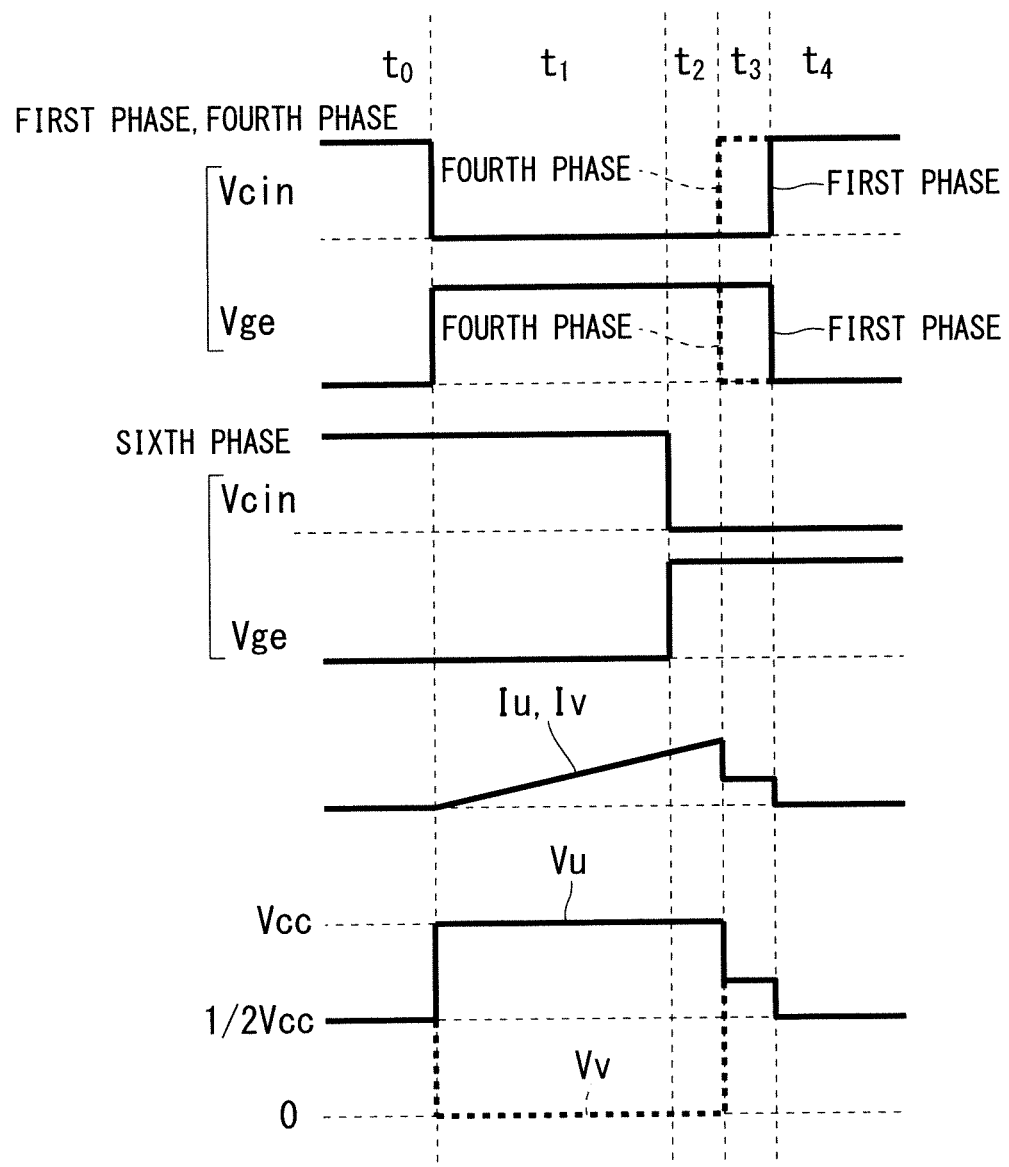
FIG. 9 is a diagram illustrating the relationship between the switching states of the first, fourth, and sixth phases and the current and voltage at the output terminals according to Embodiment 1.

FIG. 9 illustrates the relationship between the switching states of the first, fourth and sixth phases and the current and voltage at the output terminals U and V in the HERIC circuit 101. The operation during the periods t0 to t2 in FIG. 9 is the same as that of the HERIC circuit 100 of the underlying technique, and thus the description thereof is omitted here. As illustrated in the period t3 in FIG. 9, when the fourth-phase IGBT 24 turns off earlier than the first-phase IGBT 21 does, the current path is that the first-phase IGBT 21, the load 13, the second-phase freewheeling diode 32, and the first-phase IGBT 21 are passed in this order as illustrated by the thin arrows in FIG. 8. In addition to the current flowing into the inverter section 11, a reflux current flowing through the sixth-phase IGBT 26 and the diode 36 is also generated, as indicated by thick arrows in FIG. 8.

Unlike the HERIC circuit 100, in the semiconductor device 101, the impedances 51 and 52 are added; therefore, the smaller current flows into the inverter section 11 and the larger reflux current flows through the reflux section 12. As a result, the potential fluctuation of the output terminal V is suppressed to be smaller than Vcc, and the conduction noise is suppressed. In FIG. 8, the magnitude relationship between both currents is represented by the thickness of the arrows indicating the paths.

B-3. Effect

The semiconductor device 101 according to Embodiment 1 includes an inverter section 11 being a full-bridge inverter, and a reflux section 12 that short-circuits between output terminals U and V of the inverter section 11. Each of the phases of the inverter unit 11 includes an IGBT 21 to 24 being a first switching element, and a freewheel diode 31 to 34 connected in antiparallel to the first switching element. The reflux section 12 includes two serial connection bodies of the IGBTs 25 and 26 being second switching elements 25 and 26 and diodes 35 and 36. The two serial connection bodies are connected in parallel between the output terminals U and V such that conduction directions thereof are opposed to each other. The semiconductor device 101 includes the impedances 51 and 52 provided between each of the freewheel diodes 31 and 32 of the upper arm and the output terminals U and V, and the impedances 53 and 54 provided between the freewheel diodes 33 and 34 of the lower arm and the input terminal N of in the inverter section 11. The impedances 51 to 54 are greater than parasitic impedance of wiring assuming that the IGBT 21 and the output terminal U, the output terminal V of the IGBT 22, and the IGBTs 23 and 24 and the input terminal N are respectively connected only by the wiring. According to the above configuration, when the switching of each of the IGBTs 21 to 24 is performed at different timing, the current flowing into the inverter section 11 and flowing through the freewheel diodes 31 to 34 can be suppressed. Therefore, the potential fluctuations of the output terminals U and V are suppressed, and the conduction noise is reduced.

C. Embodiment 2

C-1. Configuration

Figure 10:
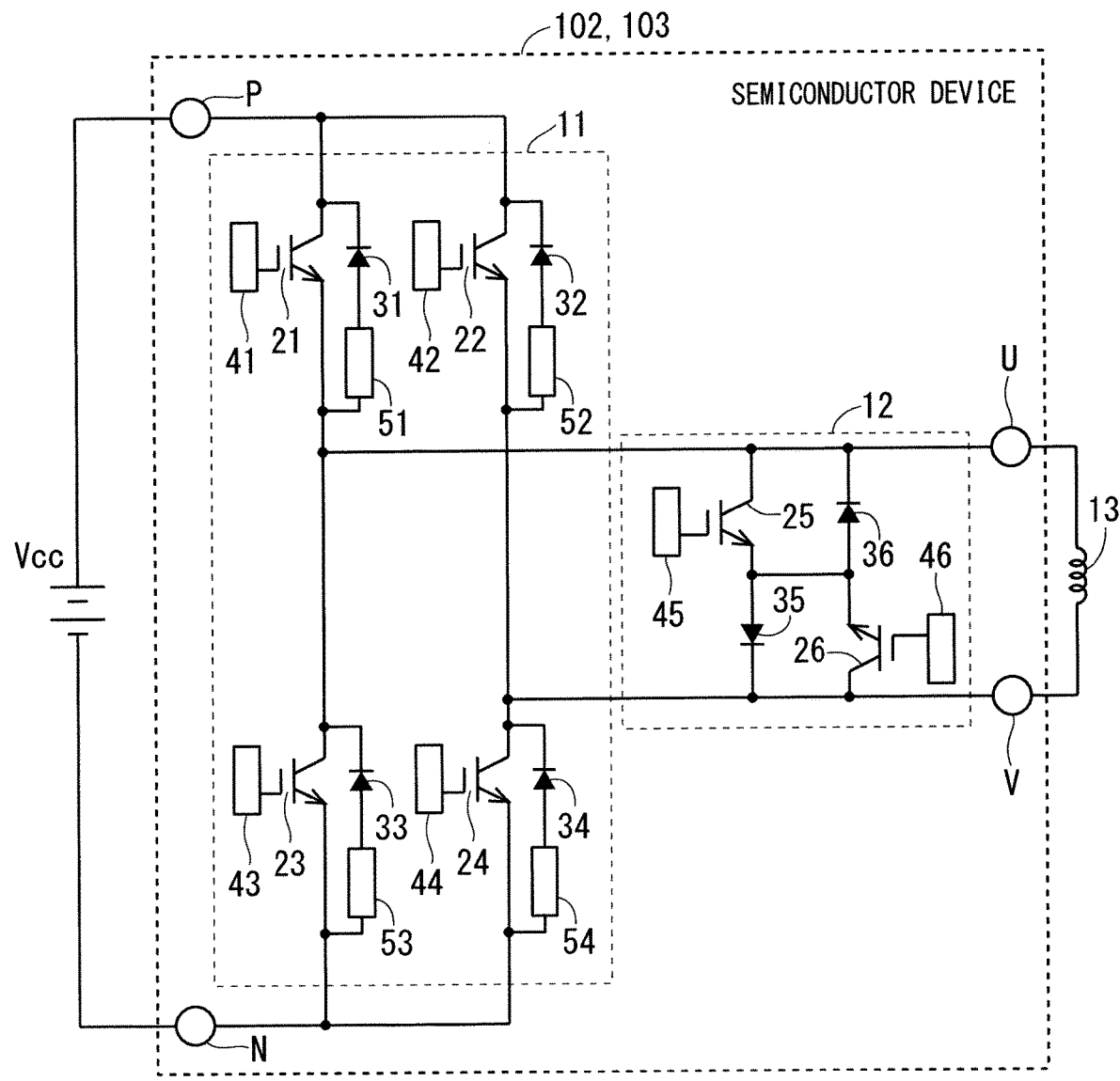
FIG. 10 is a circuit diagram of a semiconductor device according to Embodiments 2 and 3.

FIG. 10 is a circuit diagram of a semiconductor device 102 according to Embodiment 2. The semiconductor device 102 is different from the semiconductor device 101 of Embodiment 1 in that the IGBTs 21 to 24 and the freewheel diodes 31 to 34 have different connection paths toward the output terminals U and V or toward the input terminal N.

Specifically, in the semiconductor device 102, the IGBT 21 is connected to the output terminal U through a path different from that of the freewheel diode 31 connected in antiparallel to the IGBT 21. Also the IGBT 22 is connected to the output terminal V through a path different from that of the freewheel diode 32 connected in antiparallel to the IGBT 22. Also the IGBT 23 is connected to the input terminal N through a path different from that of the freewheel diode 33 connected in antiparallel to the IGBT 23. Also the IGBT 24 is connected to the input terminal N through a path different from that of the freewheel diode 34 connected in antiparallel to the IGBT 24.

With this configuration, in the semiconductor device 102, the IGBTs 21 to 24 operate without being affected by the impedances 51 to 54. In other respects, the semiconductor device 102 is similar to the semiconductor device 101.

Figure 11:
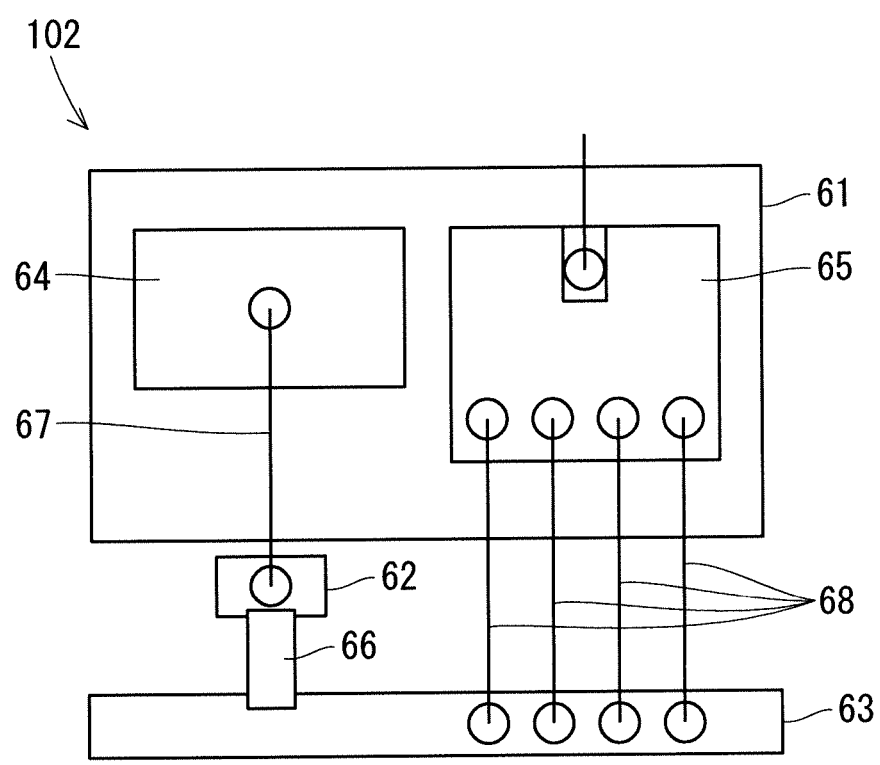
FIG. 11 is a diagram illustrating an internal structure of the semiconductor device according to Embodiment 2.

FIG. 11 illustrates the internal structure of the semiconductor device 102. The semiconductor device 102 includes a circuit pattern 61 being a metal pattern, an impedance pattern 62, an electrode pattern 63, a diode chip 64 and an IGBT chip 65, impedance 66, and external wirings 67 and 68.

A diode chip 64 and an IGBT chip 65 are mounted on the upper surface of the circuit pattern 61. The diode chip 64 corresponds to the freewheel diodes 31 to 34, and the IGBT chip 65 corresponds to the IGBTs 21 to 24. In FIG. 11, although one diode chip 64 and one IGBT chip 65 are illustrated, in reality, the number of chips corresponding to the number of IGBTs and freewheel diodes in the inverter section 11 is mounted on the circuit pattern 61.

The circuit pattern 61 functions as the cathodes of the freewheel diodes 31 to 34 and the collectors of the IGBTs 21 to 24. The upper surface of the diode chip 64 constitutes the anodes of the freewheeling diodes 31 to 34, and the upper surface of the IGBT chip 65 constitutes the gates or emitters of the IGBTs 21 to 24.

The upper surface of the diode chip 64 and the impedance pattern 62 are connected by external wiring 67. Then, the impedance 66 is connected between the impedance pattern 62 and the electrode pattern 63. The impedance 66 corresponds to the impedances 51 to 54. The electrode pattern 63 corresponds to the output terminals U and V or the input terminal N. The emitter on the upper surface of the IGBT chip 65 and the electrode pattern 63 are connected by external wiring 68. The external wiring 68 is also referred to as first external wiring.

Thus, while the anodes of the freewheel diodes 31 to 34 are connected to the electrode pattern 63 via the impedance pattern 62, the emitters of the IGBTs 21 to 24 are connected to the electrode pattern 63 without interposing the impedance pattern 62. This allows the IGBTs 21 to 24 to operate without being affected by the impedances 51 to 54. Therefore, according to the semiconductor device 102 of Embodiment 2, in addition to the effect of reducing the conduction noise described in Embodiment 1, the effect of reducing the loss of the IGBTs 21 to 24 can be obtained.

The impedances 51 to 54 are preferably greater than the parasitic impedance of the external wiring 68 that connects the emitters of the IGBTs 21 to 24 in the inverter section 11 and the output terminals U and V or the input terminal N. This is because in so doing the current flowing into the freewheel diodes 31 to 34 of the inverter section 11 at the time of reflux is to be further suppressed, and the enhanced effect of reducing the conduction noise is ensured.

C-2. Effect

In the semiconductor device 102 according to Embodiment 2, in the upper arm, the IGBT 21 and the IGBT 22 being the first switching elements are connected to the output terminals U and V, respectively, through paths different from those of the freewheel diodes 31 and 32 connected in antiparallel to the IGBTs 21 and 22 to be connected to the output terminals U and V, and in the lower arm, the IGBT 23 and the IGBT 24 being the first switching elements are connected to the input terminal N, respectively, through paths different from those of the freewheel diodes 33 and 34 connected in antiparallel to the IGBTs 23 and 24 to be connected to the input terminal N. Therefore, each of the IGBTs 21 to 24 of the inverter section 11 can operate without being affected by the impedances 51 to 54, and the loss of the IGBT is reduced.

D. Embodiment 3

C-1. Configuration

The circuit diagram of the semiconductor device 103 of Embodiment 3 is as illustrated in FIG. 10, and is similar to the semiconductor device 102 of Embodiment 2.

Figure 12:
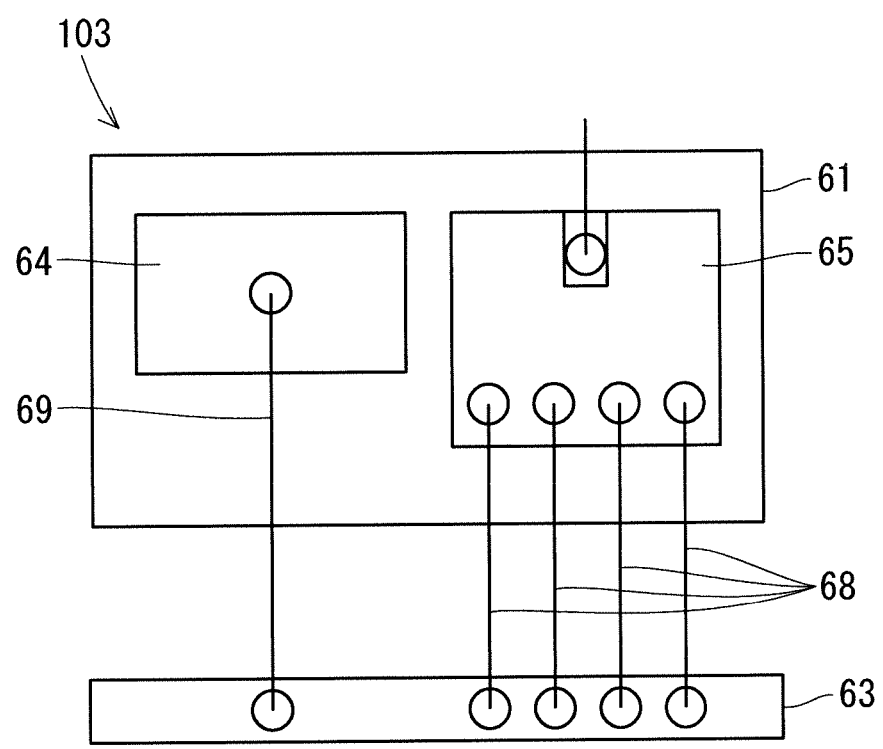
FIG. 12 is a diagram illustrating an internal structure of the semiconductor device according to Embodiment 3.

FIG. 12 illustrates the internal structure of the semiconductor device 103. In the semiconductor device 103, the anodes of the freewheel diodes 31 to 34 of the inverter section 11 are connected to the electrode pattern 63 corresponding to the output terminals U and V or the input terminal N by the external wiring 69. The external wiring 69 constitutes the impedances 51 to 54. In other respects, the semiconductor device 103 is similar to the semiconductor device 102. The external wiring 69 is also referred to as second external wiring.

D-2. Effect

In the semiconductor device 103 of Embodiment 3, the anodes of the freewheel diodes 31 and 32 are connected to the output terminals U and V, respectively, in the upper arm and the anodes of the freewheel diodes 33 and 34 are connected to the input terminal N in the lower arm by the external wiring 69 being the second external wiring. And the external wiring 69 constitutes the impedances 51 to 54. With such a configuration, the quantity of the impedances 51 to 54 is adjustable by the diameter and length of the external wiring 69. Therefore, this ensures the application of the desired impedances 51 to 54, leading to improvement in the productivity in module assembly.

Specifically, the smaller the diameter of the external wiring 69, the longer the length thereof, and the smaller the number of wires thereof, the higher the impedance of the external wiring 69. The diameter, length, and the number of wires of the external wiring 69 are adjusted such that the impedance is greater than that of the external wiring 68 between at least the emitters of the IGBTs 21 to 24 and the electrodes.

E. Embodiment 4

E-1. Configuration

The circuit diagram of the semiconductor device 104 of Embodiment 4 is the same as the circuit diagram of the HERIC circuit 100 of the underlying technique illustrated in FIG. 1. In the semiconductor device 104, the effective area of the freewheel diodes 31 to 34 in the inverter section 11 is smaller than the effective area of the IGBTs 21 to 24 to which the freewheel diodes 31 to 34 are connected in antiparallel.

E-2. Effect

In the semiconductor device 104, the effective area of the freewheel diodes 31 to 34 in the inverter section 11 is smaller than the effective area of the IGBTs 21 to 24 to which the freewheel diodes 31 to 34 are connected in antiparallel. The smaller the effective area of the freewheel diodes 31 to 34, the higher the impedances of the freewheel diodes 31 to 34. Therefore, by setting the effective area of freewheel diodes 31 to 34 to be smaller than the effective area of IGBTs 21 to 24, the freewheel diodes 31 to 34 per se have impedances equivalent to the impedances 51-54 in Embodiments 1 to 3. Therefore, according to the semiconductor device 104 of Embodiment 4, the same effect as the semiconductor device provided with the impedances 51 to 54 is obtained without providing the separate impedances 51 to 54 between the anodes and the electrodes of the freewheel diodes 31 to 34, leading to improvement in the productivity in module assembly.

F. Embodiment 5

F-1. Configuration

Figure 13:
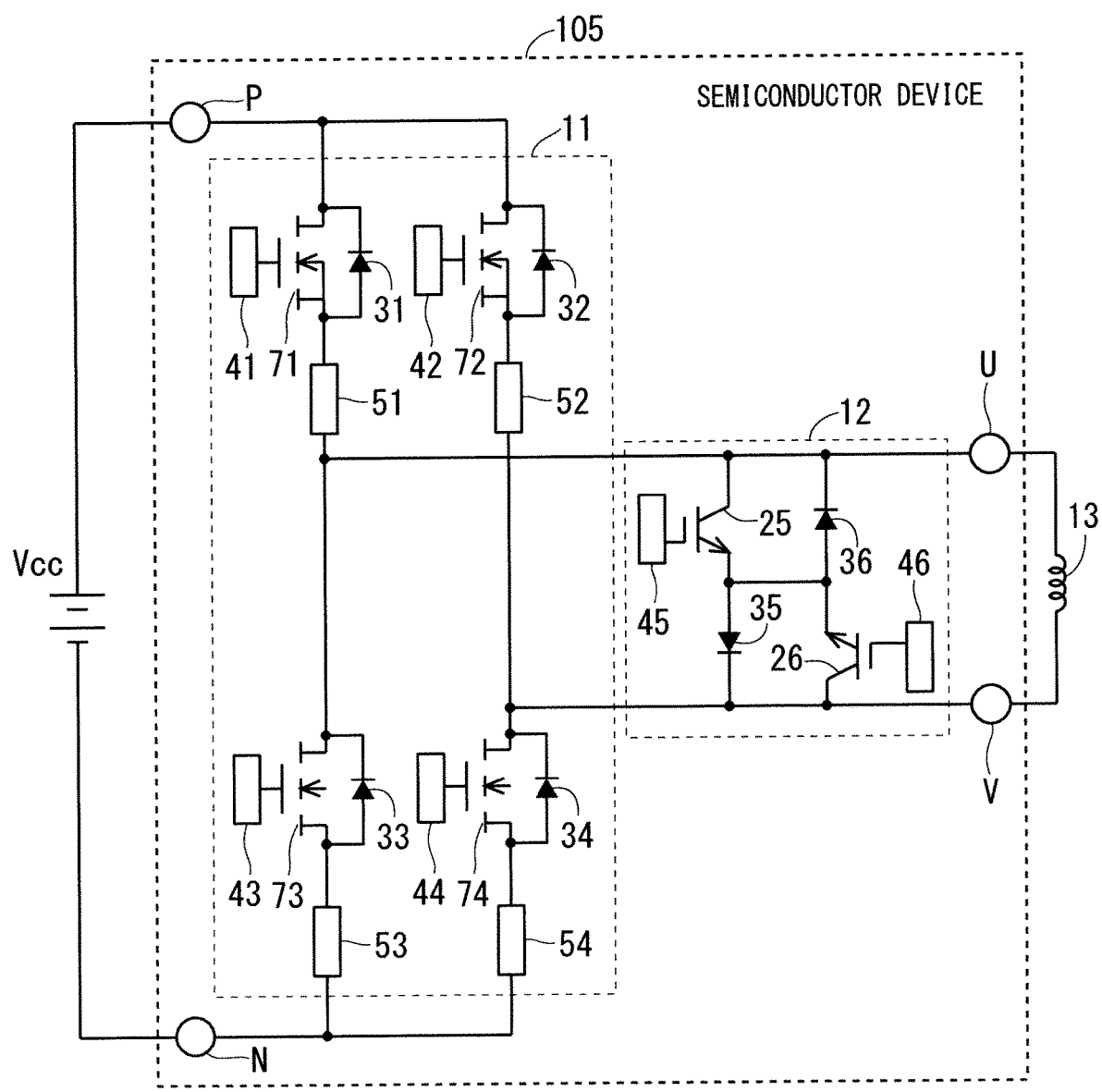
FIG. 13 is a circuit diagram of a semiconductor device according to Embodiment 5.

FIG. 13 is a circuit diagram of a semiconductor device 105 according to Embodiment 5. In the semiconductor device 105, Metal Oxide Semiconductor Field Effect Transistors (MOSFET) 71 to 74 are used for the switching elements of the inverter section 11 instead of the IGBTs. The freewheel diodes 31 to 34 of the inverter section 11 are composed of body diodes of the MOSFETs 71 to 74. The configuration of the semiconductor device 105 other than this configuration is the same as that of the semiconductor device 101 of Embodiment 1.

F-2. Effect

In the semiconductor device 105 according to Embodiment 5, the first switching elements are the MOSFETs 21 to 24 and the freewheel diodes 31 to 34 are the body diodes of the MOSFETs 31 to 34. The body diodes of the MOSFETs 31 to 34 have higher parasitic impedance than a regular diode; therefore, the current flowing into the inverter section 11 at the time of reflux is further suppressed by configuring the freewheel diodes 31 to 34 with such body diodes. As a result, the enhanced effect of reducing the conduction noise is ensured.

Further, in the semiconductor device 105 of Embodiment 5, the semiconductor material of the MOSFET may be SiC. As a result, switching loss can be significantly reduced, and the semiconductor device 105 can be operated under higher temperature environment.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   an inverter section being a full-bridge inverter; and
   a reflux section that short-circuits between output terminals of the inverter section, wherein
   each of phases of the inverter section includes
   a first switching element, and
   a freewheel diode connected in antiparallel to the first switching element, the reflux section includes two serial connection bodies of second switching elements and diodes, the two serial connection bodies are connected in parallel between the output terminals such that conduction directions thereof are opposed to each other, impedance is provided between each of the freewheel diodes of an upper arm and the output terminals, and impedance is provided between each of the freewheel diodes of a lower arm and input terminals in the inverter section, and the impedances are greater than parasitic impedance of wiring assuming that the first switching elements and the output terminals or the first switching elements and the input terminal are connected only by the wiring.

2. The semiconductor device according to claim 1, wherein, in the upper arm, each of the first switching elements are connected to the output terminals, respectively, through paths different from those of the freewheel diodes connected in antiparallel to the first switching elements to be connected to the output terminals, and in the lower arm, each of the first switching elements are connected to the input terminal, respectively, through paths different from those of the freewheel diodes connected in antiparallel to the first switching elements to be connected to the input terminal.

3. The semiconductor device according to claim 2, wherein, each of the first switching elements are connected to the output terminals, respectively, in the upper arm and each of the first switching elements are connected to the input terminal, respectively, in the lower arm by first external wiring, and the impedance between each of the freewheel diodes and the output terminals or the impedance between each of the freewheel diodes and the input terminal is greater than parasitic impedance of the first external wiring.

4. The semiconductor device according to claim 2, wherein an anode of each of the freewheel diodes is connected to the output terminals, respectively, in the upper arm and an anode of each of the freewheel diodes is connected to the input terminal, respectively, in the lower arm by second external wiring, and the second external wiring constitutes the impedances.

5. The semiconductor device according to claim 1, wherein an effective area of each of the freewheel diodes is smaller than an effective area of the first switching element to which each of the freewheel diodes is connected in antiparallel.

6. The semiconductor device according to claim 1, wherein the first switching element is an IGBT.

7. The semiconductor device according to claim 1, wherein the first switching element is a MOSFET, and the freewheel diode is a body diode of the MOSFET.

8. The semiconductor device according to claim 6, wherein a semiconductor material of the MOSFET is SiC.

* * * * *